United States Patent
Lin et al.

(10) Patent No.: US 9,401,412 B2
(45) Date of Patent: Jul. 26, 2016

(54) METHODS OF FABRICATING DIODES WITH MULTIPLE JUNCTIONS

(71) Applicants: Xin Lin, Phoenix, AZ (US); Hongning Yang, Chandler, AZ (US); Jiang-Kai Zuo, Chandler, AZ (US)

(72) Inventors: Xin Lin, Phoenix, AZ (US); Hongning Yang, Chandler, AZ (US); Jiang-Kai Zuo, Chandler, AZ (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/804,097

(22) Filed: Jul. 20, 2015

(65) Prior Publication Data

US 2015/0325674 A1    Nov. 12, 2015

Related U.S. Application Data

(62) Division of application No. 14/072,151, filed on Nov. 5, 2013, now Pat. No. 9,093,567.

(51) Int. Cl.
| | |
|---|---|
| H01L 21/336 | (2006.01) |
| H01L 29/66 | (2006.01) |
| H01L 29/861 | (2006.01) |
| H01L 29/06 | (2006.01) |
| H01L 21/3205 | (2006.01) |
| H01L 21/265 | (2006.01) |
| H01L 29/08 | (2006.01) |

(52) U.S. Cl.
CPC ........ *H01L 29/66121* (2013.01); *H01L 21/265* (2013.01); *H01L 21/26513* (2013.01); *H01L 21/32053* (2013.01); *H01L 29/0649* (2013.01); *H01L 29/08* (2013.01); *H01L 29/6609* (2013.01); *H01L 29/66128* (2013.01); *H01L 29/861* (2013.01); *H01L 29/8611* (2013.01)

(58) Field of Classification Search
CPC .............................. H01L 29/66; H01L 27/088
USPC .......................................... 257/298; 438/258
See application file for complete search history.

(56) References Cited

U.S. PATENT DOCUMENTS

| | | | | |
|---|---|---|---|---|
| 4,686,551 A * | 8/1987 | Mihara | ............... | H01L 29/0626 257/339 |
| 4,766,469 A | 8/1988 | Hill | | |
| 6,439,514 B1 * | 8/2002 | Yamaguchi | ....... | H01L 21/76264 257/347 |
| 7,279,768 B2 * | 10/2007 | Kanda | ................. | H01L 29/1083 257/487 |
| 8,299,578 B1 * | 10/2012 | Babcock | ............. | H01L 29/0649 257/487 |
| 8,710,617 B2 * | 4/2014 | Yamashita | .......... | H01L 27/0629 257/162 |
| 9,018,673 B2 * | 4/2015 | Chen | ..................... | H01L 29/866 257/106 |

(Continued)

*Primary Examiner* — Caleb Henry (57) ABSTRACT

An embodiment of a method of fabricating a diode having a plurality of regions of a first conductivity type and a buried region of a second conductivity type includes performing a first dopant implantation procedure to form the buried region, performing a second dopant implantation procedure to form an intermediate region of the plurality of regions, and performing a third dopant implantation procedure to form a contact region of the plurality of regions. The second and third dopant implantation procedures are configured such that the intermediate region is electrically connected with the contact region. The first, second, and third dopant implantation procedures are configured such that the buried region extends laterally across the contact region and the intermediate region to establish first and second junctions of the diode, respectively, and such that the first junction has a lower breakdown voltage than the second junction.

20 Claims, 5 Drawing Sheets

(56) References Cited

U.S. PATENT DOCUMENTS

| | | | | |
|---|---|---|---|---|
| 9,040,384 B2* | 5/2015 | Lin | ............ | H01L 29/861 438/356 |
| 2007/0063274 A1* | 3/2007 | Kanda | ............ | H01L 21/761 257/335 |
| 2008/0203534 A1* | 8/2008 | Xu | ............ | H01L 27/0259 257/577 |
| 2008/0246086 A1* | 10/2008 | Korec | ............ | H01L 29/41741 257/343 |
| 2009/0278168 A1* | 11/2009 | Hwang | ............ | H01L 27/0262 257/173 |
| 2010/0244088 A1* | 9/2010 | Whitfield | ............ | H01L 27/0259 257/106 |
| 2012/0043608 A1* | 2/2012 | Yang | ............ | H01L 29/0653 257/336 |
| 2013/0341717 A1* | 12/2013 | Chen | ............ | H01L 29/66659 257/337 |
| 2014/0001545 A1* | 1/2014 | Yang | ............ | H01L 29/66689 257/337 |
| 2014/0061731 A1* | 3/2014 | Chen | ............ | H01L 29/872 257/272 |
| 2014/0070311 A1* | 3/2014 | Yang | ............ | H01L 29/66689 257/335 |
| 2014/0070312 A1* | 3/2014 | Yang | ............ | H01L 29/66681 257/337 |
| 2014/0209988 A1* | 7/2014 | Lin | ............ | H01L 29/66825 257/298 |

* cited by examiner

METHODS OF FABRICATING DIODES WITH MULTIPLE JUNCTIONS

CROSS-REFERENCE TO RELATED APPLICATION

This application is a divisional application of U.S. application Ser. No. 14/072,151, entitled "Diodes with Multiple Junctions and Fabrication Methods Therefor" and filed Nov. 5, 2013, the entire disclosure of which is hereby incorporated by reference.

FIELD OF INVENTION

The present embodiments relate to semiconductor devices.

BACKGROUND

Integrated circuits (ICs) and other electronic apparatus often include arrangements of interconnected field effect transistor (FET) devices, also called metal-oxide-semiconductor field effect transistors (MOSFETs), or simply MOS transistors or devices. A control voltage applied to a gate electrode of the FET device controls the flow of current through a controllable conductive channel between source and drain electrodes.

Power transistor devices are designed to be tolerant of the high currents and voltages that are present in power applications such as motion control, air bag deployment, and automotive fuel injector drivers. One type of power transistor is a laterally diffused metal-oxide-semiconductor (LDMOS) transistor. Power transistor devices may have a number of features customized to prevent breakdown resulting from the high electric fields arising from such high voltages.

Power transistor devices are often combined in ICs with low voltage FET transistor devices. The low voltage devices provide logic or analog functionality to support the operation of the high voltage devices.

The fabrication process flow is thus configured with a considerable number of dopant implantation and other procedures directed to creating features specific to the high voltage FET devices and the low voltage FET devices. The procedures may be highly customized to optimize the features of the high and low voltage devices. The customization of the procedures may not be conducive to fabricating conventional designs of other semiconductor devices, such as diodes, in the same process flow. The customization of the procedures may also result in expenses that leave little, if any, resources for implementing procedures customized for fabricating such other semiconductor devices.

BRIEF DESCRIPTION OF THE DRAWINGS

The components and the figures are not necessarily to scale, emphasis instead being placed upon illustrating the principles of the invention. Moreover, in the figures, like reference numerals designate corresponding parts throughout the different views.

DETAILED DESCRIPTION OF THE PRESENTLY PREFERRED EMBODIMENTS

Diodes having multiple junctions are described. Methods of fabricating such diodes are also described. The multiple junctions may be positioned and otherwise configured such that breakdown does not occur at a junction adjacent or near an isolation region, e.g., a shallow trench isolation (STI) region, of the diode disposed between anode and cathode contact regions of the diode. The diodes may be configured such that the junction at which breakdown occurs during stress testing or other operations is an inner or remote junction positioned farthest from the isolation region. With breakdown occurring only at the inner junction, hot carriers generated during breakdown may be less likely to become trapped in the isolation region, e.g., at an STI wall. The disclosed diodes may exhibit lower leakage current, and/or less drift, and/or increased stability, in leakage current over time, as a result of the absence or reduction of charge trapped in the isolation region.

The disclosed diode embodiments may be configured with non-uniform and/or composite cathode and anode regions to establish the multiple junctions. For example, the leakage current stability may be provided by a composite anode region having an intermediate anode region disposed between an anode contact region and the isolation region. A composite cathode region may include a buried cathode region that extends laterally across the composite anode region to establish two vertically oriented junctions. The composite cathode region may include a further buried region at the anode contact region to establish a third vertically oriented junction.

The anode and cathode regions of the disclosed diode embodiments may be formed with dopant implantation procedures configured for forming various regions of a separate FET device located in another portion of the same substrate. Multiple implantation procedures may be combined, e.g., overlapped, to achieve a desired dopant concentration level and therefore establish a target or desired breakdown voltage for a respective junction of the diode. For example, one or more n-type well implantation procedures configured for forming power FET devices may be used to form a buried cathode region of the disclosed device embodiments. Implantation procedures configured to form n-type and p-type FET terminal extension regions may be used to form a further buried cathode region and the intermediate anode region, respectively. The further buried cathode region may have a dopant concentration level to establish a breakdown voltage level for the inner or remote junction farthest away from the isolation region and, thus, the breakdown voltage of the diode. In some examples, the breakdown voltage level of the remote junction is approximately 7 Volts. The other junctions may be configured to breakdown at any voltage higher than that level.

The implantation procedures may also have a dopant concentration profile to establish a desired depth of one or more of the junctions. For example, a dopant concentration profile of an implantation procedure used to form the intermediate anode region may establish a junction having a shallower depth than other junctions of the diode. However, the depths of the junctions may vary. For instance, the intermediate anode region may establish a junction at the same depth as an inner anode region. The depth of the junction at the intermediate anode region may also be deeper than the junction at the inner anode region in cases, for instance, in which the intermediate anode region has a lower doping concentration than the inner anode region.

The disclosed diode embodiments may include a silicide block to reduce or prevent leakage at the isolation region. The silicide block may be disposed over the junction nearest the isolation region. The silicide block may cover an interface between the intermediate anode region and the isolation region. The silicide block may be used as a hard mask in forming the anode contact region.

Although described below in connection with a silicon-on-insulator (SOI) substrate, the disclosed devices and fabrication methods are not limited to any particular substrate type, material, or fabrication technology. The semiconductor substrates of the disclosed devices may vary. Although described below in connection with p-type substrates, the disclosed devices are not limited to any particular conductivity type. Each semiconductor region, layer or other structure in the examples described below may have a conductivity type, e.g., n-type or p-type, opposite to the type identified in the examples below. Embodiments of the disclosed diodes may thus have an arrangement in which the polarity of the electrodes is switched from the examples shown.

Figure 1:
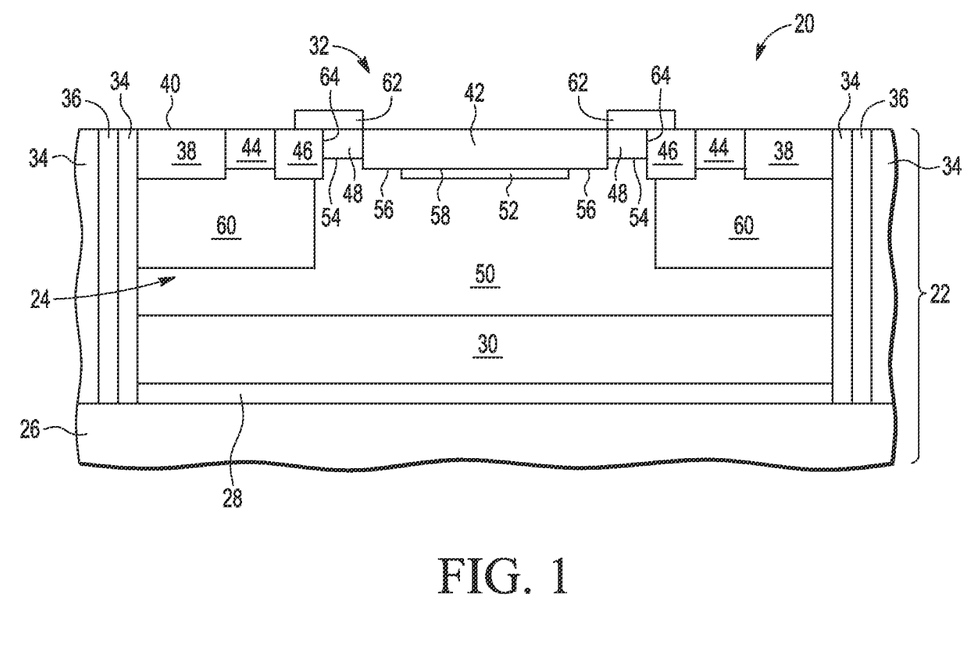
FIG. 1 is a cross-sectional, schematic view of an exemplary diode having multiple junctions in accordance with one embodiment.

FIG. 1 is a schematic cross-sectional view of an example of a diode 20 constructed in accordance with one embodiment. The diode 20 includes a semiconductor substrate 22, which may, in turn, include a number of epitaxial layers 24. In this example, the semiconductor substrate 22 includes a single p-type epitaxial layer grown on a base or original substrate 26. The original substrate 26 may include a lightly or heavily doped n-type or p-type bulk substrate, e.g., a handle wafer, and may include one or more epitaxial layers. In this example, a lightly doped re-type substrate may be used. The device 20 may alternatively or additionally include non-epitaxial layers in which one or more device regions are formed. Any one or more of the layers of the semiconductor substrate 22 may include silicon. Other semiconductor materials may be used, including both elementary and compound semiconductor materials.

In this embodiment, the semiconductor substrate 22 has a silicon-on-insulator (SOI) construction having a buried insulator layer 28. The buried insulator layer 28 may include a silicon oxide layer having a thickness of, e.g., about 0.3 microns (μm), but other thicknesses, materials, and layers may be used. The silicon layer over the buried insulator layer 28 may be doped to define a layer 30. The layer 30 may have a thickness of, e.g., about 1.2 μm to about 1.5 μm, but other thicknesses may be used. The layer 30 may act as a seed layer for growth of the epitaxial layer 24. For example, following the doping of the layer 30, about an additional 3.5 μm of semiconductor material may be grown, but other epitaxial thicknesses may be used. With the growth of the epitaxial layer 24, the layer 30 becomes a buried layer 30. In this example, the buried layer 30 is doped n-type. The buried layer 30 is optional. For example, in some cases, the semiconductor substrate 22 includes a floating epitaxial layer instead of the buried layer 30.

The structural, material, and other characteristics of the semiconductor substrate 22 may vary from the example shown. Additional, fewer, or alternative layers may be included in the semiconductor substrate 22. For example, any number of additional semiconductor and/or non-semiconductor layers may be included. The disclosed devices are thus not limited to, for instance, SOI or bulk substrates, or substrates including epitaxially grown layers, and instead may be supported by a wide variety of other types of semiconductor substrates.

A device area 32 of the diode 20 is depicted in FIG. 1. The device area 32 may be defined by one or more isolation trenches. In this example, a single, ring-shaped isolation trench surrounds the device area 32 and includes a pair of deep trench isolation (DTI) regions 34 laterally spaced from one another in the epitaxial layer(s) 24. The DTI regions 34 may reach the original substrate 26 as shown. The DTI region(s) 34 may include an insulating material, such as $SiO_2$. The DTI regions 34 may isolate the device area 32 from the surrounding substrate 22 by laterally surrounding the device area 32 and extending downward to reach to at least the depth of the buried insulator layer 28 or other device isolating layer. In this embodiment, the insulating layer 28 extends laterally across, e.g., under, the device area 32 to act as a vertical barrier separating the device area 32 from the original substrate 26.

The isolation trench(es) may include a substrate connection to bias the original substrate 26. In this example, the isolation trench includes a substrate tie 36 disposed between the DTI regions 34. The substrate tie 36 may be configured as an inner conductive trench, such as a doped polysilicon plug, that extends from a surface of the substrate 22 through the buried insulating layer 28 to establish the electrical connection to the original substrate 26. The DTI regions 34 and the substrate tie 36 may thus laterally and/or otherwise surround the device area 32.

The lateral extent of the device area 32 may also be defined by one or more additional trench isolation regions. In this example, the device area 32 is further defined by a shallow trench isolation (STI) region 38 disposed at a surface 40 of the semiconductor substrate 22. In this example, the surface 40 corresponds with an upper surface of the epitaxial layer 24. The STI region 38 may be ring-shaped. In this example, the STI region 38 is disposed adjacent an inner one of the DTI regions 34. The STI region 38 may be used to provide further separation between the substrate tie 36 and the active area 32 of the diode 20.

The diode 20 includes contact regions 42 and 44 laterally spaced from one another along the surface 40 of the semiconductor substrate 22. The diode 20 may be considered to be configured or arranged as a vertical diode. In this embodiment, the contact region 42 is p-type and thus configured as an anode contact region. The contact region 44 is n-type and thus configured as a cathode contact region.

Figure 2:
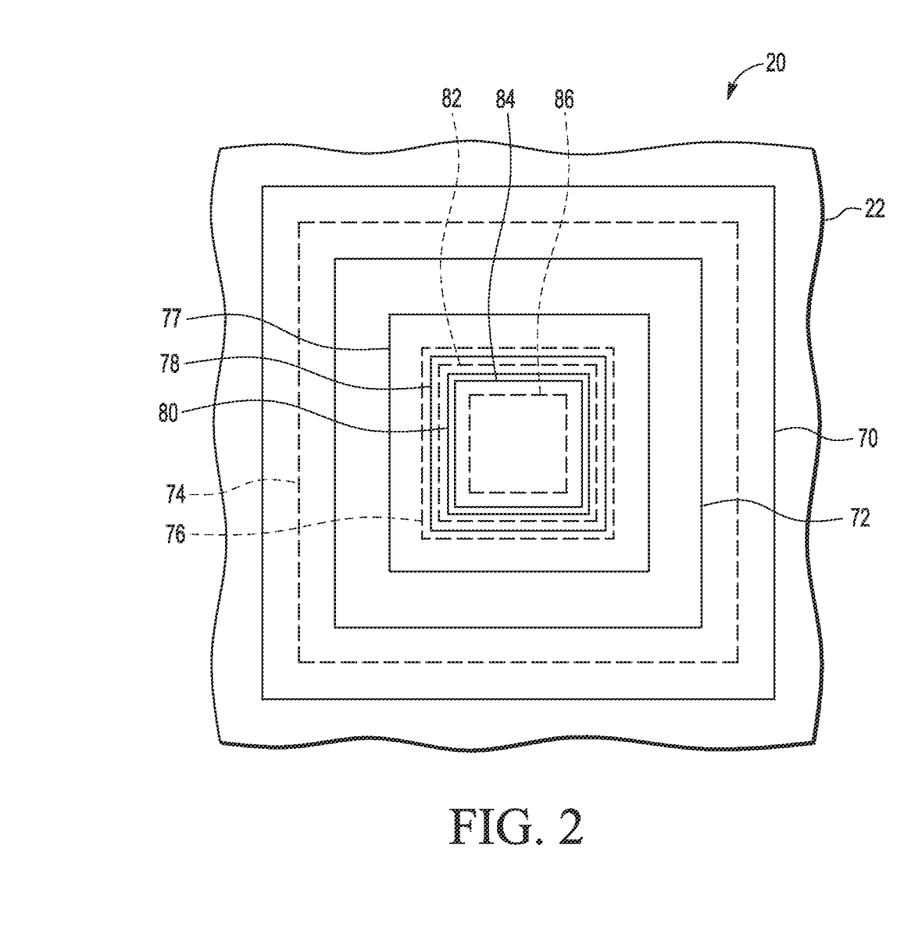
FIG. 2 is a plan view of the diode of FIG. 1.

In this embodiment, the anode contact region 42 corresponds with an inner electrode of the diode 20, while the cathode contact region 44 corresponds with an outer electrode of the diode 20. The cathode contact region 44 may be ring-shaped to surround the anode contact region 42. An example of the ring shape is shown in the embodiment of FIG. 2. In other embodiments, the conductivity types of the contact regions 42, 44 may be switched to provide a diode with a reverse polarity.

In the embodiment of FIG. 1, the diode 20 includes an isolation region 46 disposed at the surface 40 of the semiconductor substrate 22 between the anode and cathode contact regions 42, 44. The isolation region 46 is used to electrically separate the anode contact region 42 (and other anode regions) and the cathode contact region 44 at the surface 40 of the semiconductor substrate 22. Such separation may lower the leakage current. The isolation region 46 may be configured as an STI region. The isolation region 46 may thus be configured similarly to the isolation region 38, although at a different location. A lower boundary of the isolation region 46 may be deeper than the lower boundaries of the anode and cathode contact regions 42, 44. For example, the lower boundary of the isolation region 46 may be at a depth of about 0.4 to about 0.5 μm, but other depths may be used. The isolation region 46 may be a ring-shaped region that laterally surrounds the anode contact region 42. An example of the ring shape is shown in the embodiment of FIG. 2.

In this example, the isolation region 46 is contiguous with (or adjacent to or directly abutting) the cathode contact region 44. Alternatively, the isolation region 46 is adjacent, but nonetheless spaced apart from, the cathode contact region 44. For example, a lightly or moderately doped n-type region, such as a portion of an n-type well region (e.g., a portion of well region 60) in which the cathode contact region 44 is formed, may be disposed between the isolation region 46 and the cathode contact region 44. In other embodiments, the diode 20 does not include the STI region as the isolation region 46. Isolation between the anode contact region 42 and the cathode contact region 44 may be provided by a silicide block (described below), which may serve as a hard mask for the implantation procedures used to form the anode contact region 42 and the cathode contact region 44, as described below.

The anode contact region 42 is part of a composite anode region of the diode 20 that further includes an intermediate anode region 48. The intermediate anode region 48 is disposed in the semiconductor substrate 22 between the isolation region 46 and the anode contact region 42. The intermediate anode region 48 may be contiguous with the anode contact region 42 or otherwise electrically connected therewith. As part of the composite anode region, the intermediate anode region 48 is p-type, but may be n-type in other embodiments in which the positions of the anode and cathode are switched.

In the embodiment of FIG. 1, the intermediate anode region 48 is a ring-shaped region that laterally surrounds the anode contact region 42. The intermediate anode region 48 is, in turn, laterally surrounded by the isolation region 46. An outer edge of the intermediate anode region 48 may abut an inner edge of the isolation region 46 to define an interface between the intermediate anode region 48 and the isolation region 46. The lower boundary of the intermediate anode region 48 is shallower than the lower boundary of the anode contact region 42 in an embodiment. In other embodiments, the lower boundary of the intermediate anode region 48 is at the same depth or deeper than the lower boundary of the anode contract region 42.

The cathode contact region 44 is part of a composite cathode region of the diode 20 that further includes a buried region 50. In this embodiment, the buried region 50 is an n-type well disposed in the semiconductor substrate 22 across the device area 32. The cathode contact region 44 may be disposed within or on the buried region 50. The cathode contact region 44 and the buried region 50 may be otherwise electrically connected with one another. For example, the composite cathode region may include one or more further regions that electrically couple the cathode contact region 44 and the buried region 50. The lateral extent of the buried region 50 may vary from the example shown. For example, the buried region 50 may be configured as a well laterally centered within the device area 32, rather than extending the entire lateral width of the device area 32 as shown.

In the embodiment of FIG. 1, the composite cathode region of the diode 20 includes a further buried region 52. The buried region 52 may be disposed in the semiconductor substrate 22 above or on the buried region 50. In this embodiment, the buried region 52 is laterally centered within the buried region 50, or otherwise disposed within the lateral extent of the buried region 50. As described below, the buried region 52 is also laterally centered within the anode contact region 42, or otherwise disposed within the lateral extent of the anode contact region 42. The buried region 52 is spaced from (i.e., not directly abutting) the intermediate anode region 48 as shown. The buried region 52 is vertically positioned between the anode contact region 42 and the buried region 50. The buried region 52 is electrically connected to the cathode contact region 44 via the buried region 50.

As described below in connection with FIG. 5, the portions of the semiconductor substrate 22 doped by the implantation procedures used to form the buried regions 50 and 52 may overlap. The buried region 52 may thus be considered to be formed within the well of the buried region 50. The dopant concentration level of the buried region 52 may thus correspond with the sum of the respective dopant concentrations provided by the implantation procedures used to form the buried regions 50 and 52. The buried regions 50, 52 are n-type, but may be p-type in other embodiments in which the positions of the anode and cathode are switched.

The diode 20 includes multiple junctions defined by the above-described composite anode and cathode regions. The multiple junctions may be disposed in parallel between the anode and cathode terminals, e.g., metal or other conductive electrodes, electrically connected to the anode and cathode contact regions 42, 44, respectively. In this example, an outer junction 54 (e.g., the junction between intermediate anode region 48 and buried region 50), a middle junction 56 (e.g., the junction between anode contact region 42 and buried region 50), and an inner junction 58 (e.g., the junction between anode contact region 42 and buried region 52) are defined. The buried region 50 extends laterally across the intermediate anode region 48 and the anode contact region 42 to establish the outer and middle junctions 54 and 56, respectively. The buried region 52 is disposed adjacent the anode contact region 42 to establish the inner junction 58.

The buried region 52 is laterally spaced from the intermediate anode region 48 to dispose the outer and middle junctions 54, 56 between the inner junction 58 and the isolation region 46. The inner junction 58 is thus farthest from the isolation region 46. Charge carriers resulting from breakdown of the inner junction 58 may thus be less likely to become trapped in the isolation region 46.

The depth of the junctions below the surface 40 of the substrate 22 may vary from the example shown, as diode stability may be improved as long as the relative breakdown voltages of the junctions are arranged as described herein. Nevertheless, in the embodiment of FIG. 1, the outer junction 54 is disposed at a shallower depth in the semiconductor substrate 22 than the middle junction 56. The position of the outer junction 54 may be controlled by the dopant implantation procedure used to form the intermediate anode region 48. The inner junction 58 and the middle junction 56 may be disposed at the same depth as shown in FIG. 1. The outer junction 54 may thus also be disposed at a shallower depth than the inner junction 58. The depth of the middle and inner junctions 56, 58 may be determined by the dopant implantation procedure used to form the anode contact region 42.

The multiple junctions have different breakdown voltage levels in an embodiment. The breakdown voltage levels differ to improve the operational stability of the diode 20. The regions of the diode 20 are doped and otherwise configured such that the breakdown voltage levels of the junctions increase as the distance between the junction and the isolation region 46 decreases. In the embodiment of FIG. 1, the middle junction 56 has a lower breakdown voltage level than the outer junction 54, and the inner junction 58 has a lower breakdown voltage level than the outer and middle junctions 54, 56. As the junction farthest from the isolation region 46, the inner junction 58 has the lowest breakdown voltage level. For example, if breakdown occurs at about 7 Volts at the inner junction 58, then charge carriers are not flowing through the other junctions 54, 56 closer to the isolation region 46 until the voltage at the cathode contact region 44 exceeds the higher breakdown voltage levels thereof. In some embodiments, the breakdown voltage of the middle junction 56 is in a range of 5 to 90 percent higher than the breakdown voltage for the inner junction 58, and the breakdown voltage of the outer junction 54 is in a range of about 5 to 100 percent higher than the breakdown voltage of the middle junction 56, although the breakdown voltage differences may be greater or less than the above-given ranges.

The constituent regions of the composite anode and cathode regions have dopant concentration levels to establish target or desired breakdown voltage levels for the multiple junctions. On the anode side, the intermediate anode region 48 has a lower dopant concentration level than the anode contact region 42. In examples in which the intermediate anode region 48 is formed via a FET terminal extension implantation procedure, such as a lightly doped drain (LDD) implantation procedure, the difference in the anode dopant concentration levels may be greater than one or two orders of magnitude. On the cathode side, the buried region 52 may have a higher dopant concentration level than the buried region 50. The difference in the cathode dopant concentration levels may be less than one order of magnitude. Example values and ranges of the dopant concentration levels are provided below.

The composite cathode region of the diode 20 may include an outer buried or well region 60 that electrically connects the buried region 50 to the cathode contact region 44. In this example, the outer well region 60 is a ring-shaped region that laterally surrounds the buried region 50. The lateral extent of the outer well region 60 may be configured to lower the series resistance of the diode 20 without affecting the breakdown voltage levels of the junctions 54, 56, 58. To avoid affecting the breakdown voltage levels, the outer well region 60 may be positioned outward of the intermediate anode region 48. In this example, the outer well region 60 overlaps the isolation region 46. An inner edge of the ring shape of the outer well region 60 is positioned at the isolation region 46. The outer well region 60 is thus spaced from each constituent region of the composite anode region and, thus, does not affect the breakdown voltage levels of the junctions 54, 56, 58. The dopant concentration level of the outer well region 60 may thus be set to a level that lowers, i.e., improves, the series resistance of the diode 20 without concern that the breakdown voltage levels would be affected. The shape and lateral extent of the well region 60 may vary from the embodiment shown in FIG. 1. For example, the well region 60 may extend inward to an extent that laterally overlaps with the isolation region 46, but not the anode contact region 42 as shown. In other embodiments, the well region 60 may extend across the device area 32 as shown and described in connection with FIG. 3. The well region 60 is n-type, but may be p-type in other embodiments in which the positions of the anode and cathode are switched.

The well region 60 may be disposed within or on the buried region 50. The dopant concentration level of the well region 60 may include the dopant concentration level resulting from the implantation procedure(s) used to form the buried region 50. The cathode contact region 44 may, in turn, be disposed within or on the well region 60.

The diode 20 includes a silicide block 62 supported by the semiconductor substrate 22. In this example, the silicide block 62 is a ring-shaped structure disposed at the surface 40 over an interface 64 between the isolation region 46 and the intermediate anode region 48. The silicide block 62 may prevent silicide from forming along the intermediate anode region 48, such as along the interface 64. For example, without the silicide block 62, silicide could be present in a trench recess at the interface 64. Undesirable levels of leakage current could then result if the silicide is close enough to the junction 54 that the depletion region reaches the silicide. The silicide block 62 extends over the intermediate anode region 48 and at least part of the isolation region 46 to help avoid such leakage current scenarios. The silicide block 62 may also serve as a mask for an implantation procedure implemented to form the anode contact region 42, as described below in connection with FIG. 5.

The diode 20 is shown in simplified form and, thus, FIG. 1 does not show the conductive, e.g., ohmic, contacts and other metal layers of the electrodes of the diode 20 and interconnects. The diode 20 may have a number of other structures or components for connectivity, isolation, passivation, and other purposes not shown in FIG. 1 for ease in illustration.

The dopant concentrations, thicknesses, and other characteristics of the above-described semiconductor regions in the semiconductor substrate 22 may vary. In one example of the embodiment shown in FIG. 1, the above-referenced semiconductor regions may have the following approximate concentrations and thicknesses (which may correspond with the depths from surface 40):

|  | Concentration | Thickness |
| --- | --- | --- |
| substrate 26: | $2 \times 10^{15}/cm^3$ | not applicable |
| buried layer 30: | $8 \times 10^{18}/cm^3$ | 1.5 µm |
| contact 42: | $2 \times 10^{21}/cm^3$ | 0.2 µm |
| contact 44: | $2 \times 10^{21}/cm^3$ | 0.2 µm |
| region 48: | $2 \times 10^{18}/cm^3$ | 0.15 µm |
| buried region 50: | $1 \times 10^{18}/cm^3$ | 3.5 µm |
| buried region 52: | $1.8 \times 10^{18}/cm^3$ | 0.1 µm |
| outer region 60: | $1.2 \times 10^{18}/cm^3$ | 3.5 µm |

The concentrations and thicknesses may be different in other embodiments. For example, the dopant concentration of the original substrate 26 may vary considerably.

FIG. 2 is a plan view of the diode 20. The plan view is simplified, as not all of the regions or structures depicted in FIG. 1 are shown for ease in illustration. For example, the components of the isolation ring that isolates the diode 20 from the remainder of the semiconductor substrate 22 are shown in simplified form as a single DTI ring. Outer and inner edges 70, 72 of the DTI ring are disposed around a periphery of the diode 20 as shown. The active areas of the diode 20 are disposed inward of the inner edge 72.

The plan view of FIG. 2 shows one example of how the anode contact region 42 (FIG. 1) is laterally surrounded by the respective rings of the outer well region 60 (FIG. 1), intermediate anode region 48 (FIG. 1), the isolation region 46 (FIG. 1), the cathode contact region 44 (FIG. 1), and isolation region 38 (FIG. 1). Working from the outer edge of the active area inward, a ring-shaped implant for the outer well region 60 (FIG. 1) has outer and inner edges 74, 76. A square-shaped implant for the buried region 50 shares the outer edge 74 and extends across the active area of the diode 20. The cathode contact region 44 (FIG. 1) is positioned between an inner edge 77 of the isolation region 38 (FIG. 1) and an outer edge 78 of the isolation region 46 (FIG. 1). An inner portion of the active area of the diode 20 begins at an inner edge 80 of the isolation region 46. The inner edge 80 of the isolation region 46 is shown in phantom in FIG. 2, as it lies underneath the silicide block 62 (FIG. 1), which has outer and inner edges 82, 84. The anode contact region 42 (FIG. 1) is a square-shaped region inside the inner edge 84 of the silicide block 62. In this example, the intermediate anode region 48 is a ring-shaped region between inner edge 84 of the silicide block 62 and the inner edge 80 of the isolation region 46. Lastly, the buried region 52 of the composite cathode region, the innermost feature of the diode 20, is formed by a square-shaped implant having a boundary 86.

The above-described composite cathode and anode regions may be configured to establish a target or desired breakdown voltage for the diode 20. The target breakdown voltage is achieved through breakdown of an inner junction, e.g., the junction 58 shown in FIG. 1, spaced from STI or other isolation regions to improve operational stability. In some examples, the diode 20 is configured as a low voltage diode. The breakdown voltage of the diode 20 may be about 7 Volts, although other voltage levels may be provided. The other junctions of the diode 20 in parallel with the inner junction that are closer to the isolation region(s) may have any breakdown voltage higher than the target breakdown voltage level.

Figure 3:
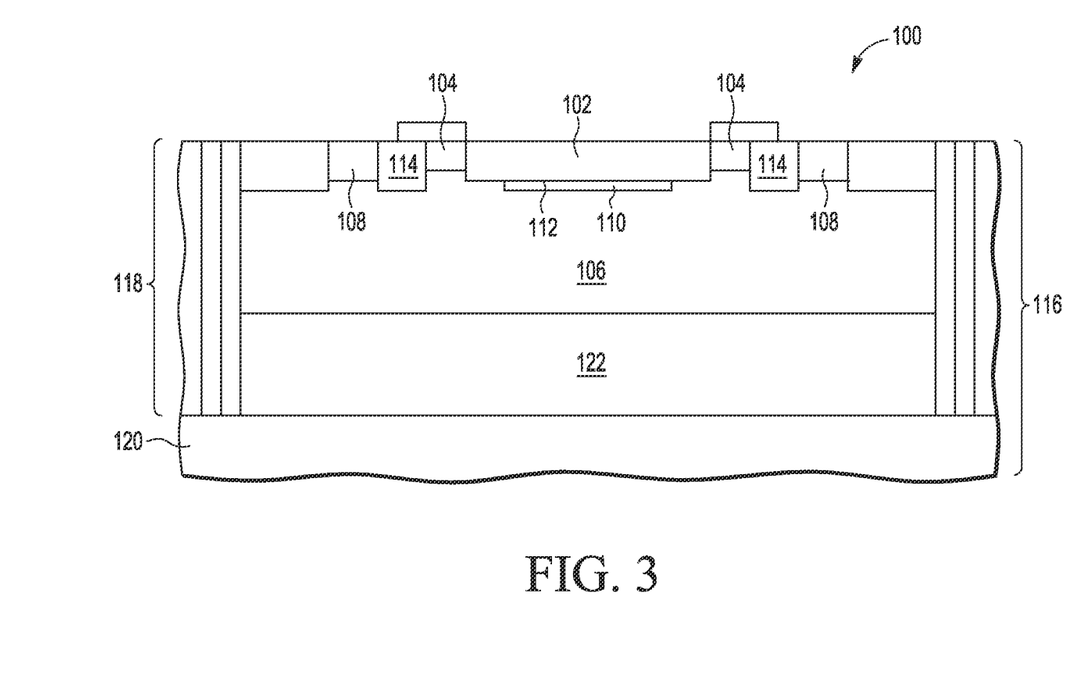
FIG. 3 is a cross-sectional, schematic view of another exemplary diode having multiple junctions in accordance with one embodiment.

FIG. 3 depicts a diode 100 having an alternative configuration that may be useful for establishing a different target breakdown voltage. The diode 100 may have a composite anode region with a central contact region 102 laterally surrounded by an intermediate ring-shaped region 104 configured similarly to the example described above. The diode 100 differs from the above-described examples in the configuration of the composite cathode region. In this embodiment, the diode 100 includes a single buried well 106 in or on which a cathode contact region 108 and a central buried region 110 are formed. The single buried well 106 replaces the buried well 50 and the outer well 60 shown in FIG. 1. In this embodiment, the implantation procedure used to form the outer well 60 may be configured to instead extend across a device area or active area of the diode 20. The area covered by the implantation procedure may correspond with the area covered by the one or more implantation procedures used to form the buried region 50. The area is configured such that the single buried well 106 extends laterally from the cathode contact region 108 to the central anode contact region 102. The single buried well 106 thus extends across the constituent regions of the composite anode region, e.g., the intermediate region 104, to establish multiple parallel junctions, as described above.

The combination of implantation procedures may result in a higher dopant concentration level in the composite cathode region at each junction of the diode 100. The higher dopant concentration level may be used to establish a lower target breakdown voltage for an inner or central junction 112 disposed farthest from an isolation region 114. In one embodiment involving the same implantation procedures used to form the diode 20 of FIG. 1, the breakdown voltage of the junction 112 decreases from a level slightly above 7 Volts, e.g., 7.3 Volts, to a level slightly below 7 Volts, e.g., 6.7 Volts. Other breakdown voltage levels may be established.

The use of multiple implantation procedures to form the buried well 106 and the buried well 50 in FIG. 1 may be useful in scenarios in which the diode 100 is formed using implantation procedures configured for other devices, such as logic and/or power FET devices. Such re-purposing of the existing implantation procedures may allow a target breakdown voltage level to be established without having to incorporate additional procedures dedicated solely to the formation of the cathode and anode regions of the diode 100 (and the diode 20 of FIG. 1) into the fabrication process.

The embodiment of FIG. 3 also differs from the examples described above in the configuration of a semiconductor substrate 116 in which the above-described regions are disposed. In this embodiment, the semiconductor substrate 116 includes an epitaxial layer 118 and an original substrate 120 on which the epitaxial layer 118 is grown. The original substrate 120 is a bulk substrate in this example. The above-described anode and cathode regions of the diode 100 are formed in the epitaxial layer 118. A portion 122 of the epitaxial layer 118 may be disposed between the diode 100 and the base substrate 120. In one example, the portion 122 of the epitaxial layer 118 may have a dopant concentration level of about $1 \times 10^{15}/cm^3$ to about $2 \times 10^{18}/cm^3$ and a thickness of about 1.5 µm, although other levels and thicknesses may be used. Additional or alternative isolation may be provided by, for instance, a buried oxide layer and/or one or more buried doped layers.

Figure 4:
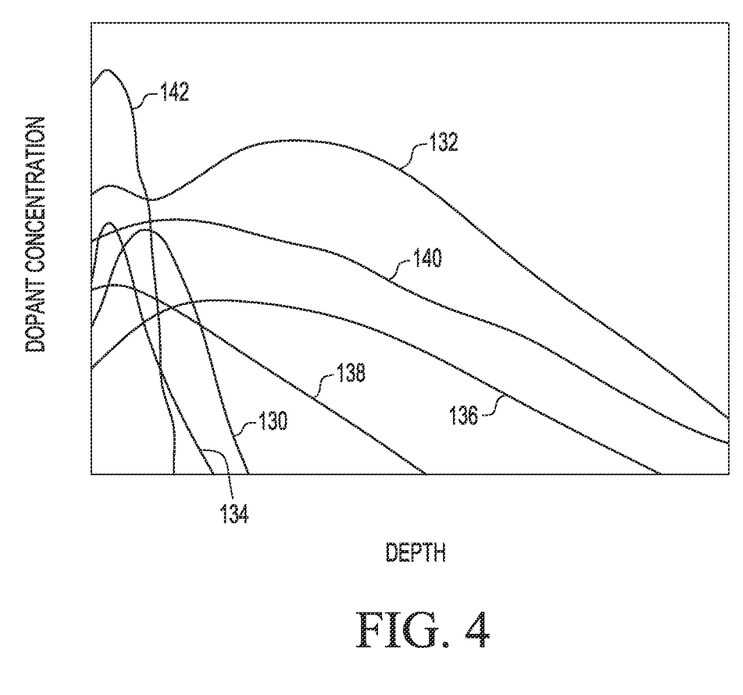
FIG. 4 is a graphical plot of exemplary dopant concentration profiles resulting from FET implantation procedures performed to form composite anode and cathode regions of a diode having multiple junctions in accordance with one embodiment.

FIG. 4 is a logarithmic graphical plot of the dopant profiles of implantation procedures existing or available in an exemplary FET process flow. In some embodiments, each doped region of the diode described herein is formed with an existing dopant implantation procedure associated with the fabrication of one or more regions of the FET device designs supported by the process flow. For example, the existing implantation procedures may be directed to fabricating a high voltage or power FET device, e.g., an LDMOS device, a high or low voltage analog FET device, or a low voltage or logic FET device. The dopant concentration, ion energy, implant angle, and/or other characteristics of the implants may thus vary in accordance with the parameters established by the FET device design(s). In other embodiments, one or more implantation masks may be used that do not correspond with an existing mask or implant. The disclosed devices are thus not limited to designs in which each feature is fabricated via an implant used to fabricate a FET device. The disclosed devices are also not limited to designs in which the dopant for each region or section thereof is provided via an implantation procedure.

One or more of the above-described regions may be formed via a respective combination of multiple implants. For example, the buried region 50 (FIG. 1) of the composite cathode region may be formed via a combination of implants for logic and power FET devices. In the embodiment shown in FIG. 4, the combination includes multiple n-type low voltage or logic FET well implants 130, 132, 134, as well as an n-type high voltage or power FET well implant 136, and an n-type power FET implant 138 directed to compensating for the p-type doping of the epitaxial layer 24 (FIG. 1) for use in an accumulation or drift region of a power FET device. The dopant distributions resulting from the implants 130, 132, 134, 136, 138 overlap to form the buried region 50.

As shown in FIG. 4, the respective dopant concentration levels and profiles of the implants 130, 132, 134, 136, 138 may vary considerably from one another in forming the buried region 50. For example, the n-type power FET implant 138 may be configured to achieve low to moderate dopant concentration levels. As shown in FIG. 4, the n-type power FET implant 138 may be considerably lighter, e.g., about an order of magnitude or more, than one of the other implants, e.g., the implant 132, used to form the buried region 50. The n-type power FET implant 138 may be useful for compensating for the p-type doping of the epitaxial layer 24 without reaching heavy n-type dopant concentration levels. In one example, the n-type power FET compensation implant 138 is configured to support a dopant concentration level of about 5×10$^{15}$/cm$^3$ to about 1×10$^{17}$/cm$^3$. The n-type power FET compensation implant 138 may also have an energy level configured for a shallow depth, which may be useful in forming an accumulation and/or drift region of an LDMOS device.

The outer buried region 60 (FIG. 1) of the composite cathode region may be formed by an n-type power FET implant 140. The implant 140 may be configured to form a body region of a p-type power FET device.

The implants used to form the anode and cathode contact regions described herein may be configured to form source/drain regions of logic and/or power FET devices. The dopant concentration levels achieved by the source/drain implants may be sufficient to form Ohmic contacts. In contrast, the implants depicted in FIG. 4 may not be heavy enough to form Ohmic contacts. For example, a FET terminal extension implant 142 used to form the intermediate anode region 48 may be configured to form a moderately or heavily doped region, such as a lightly doped drain (LDD) region of a power FET device. In the example of FIG. 1, the implant 142 may thus be a p-type LDD (PLDD) implant. The lower dopant concentration level provided by the FET terminal extension implant 142 may be used to establish a higher breakdown voltage level for the outer junction 54, i.e., the junction closest to the isolation region 46 (FIG. 1). As shown in FIG. 4, the FET terminal extension implant 142 may have a dopant profile shallower than the other implants.

An n-type LDD (NLDD) implant may be used to form the buried region 52 at which the junction 58 farthest from the isolation region is formed, e.g., the innermost or center junction. The dopant concentration profile of the NLDD implant may be similar to the profile of the implant 142. The n-type dopant provided by the NLDD implant adds to the n-type dopant provided by the well implants 130, 132, 134, 136, 138 to establish the lowest breakdown voltage for the innermost junction 58. The NLDD implant and the well implants 130, 132, 134, 136, 138 may be configured such that the buried regions 50, 52 have dopant concentration levels on a same order of magnitude at the breakdown junctions. For example, the dopant concentration level of the buried region 50 may be about 4×10$^{17}$/cm$^3$ and the dopant concentration level of the buried region 52 may be about 7×10$^{17}$/cm$^3$. Other dopant concentration levels may be established and used.

The dopant ions, energy levels for the above-described implants may vary. In one example of the embodiment shown in FIG. 4, the above-referenced implants may have the following approximate peak ion implant energies:

|  | Ion | Ion Energy | Angle |
|---|---|---|---|
| logic FET well implant 130: | As | 450 KeV | 0° |
| logic FET well implant 132: | P | 1.0 MeV | 0° |
| logic FET well implant 134: | Sb | 135 KeV | 0° |
| power FET well implant 136: | P | 1500 KeV | 1° |
| power FET comp implant 138: | P | 720 KeV | 1° |
| power FET body implant 140: | P | 2000 KeV | 1° |
| power FET PLDD implant 142: | B | 5 KeV | 0° |
| power FET NLDD implant: | P | 35 KeV | 0° |

Different, fewer, or additional dopant ions may be used for one or more of the above-described regions and/or implants. For example, one of the three implantation procedures for the low voltage n-type well region may be omitted. The implantation procedures described herein may use the same or different dopant ions.

Figure 5:
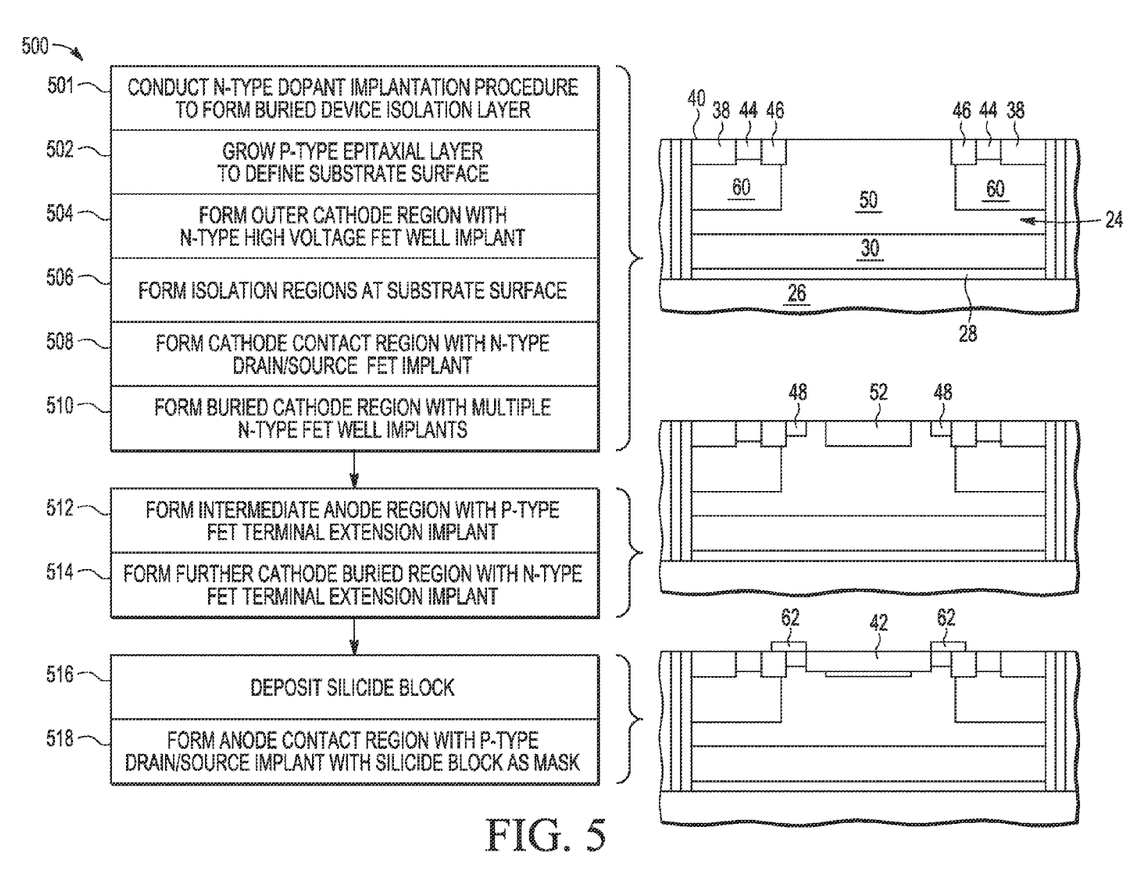
FIG. 5 is a flow diagram of an exemplary fabrication sequence to fabricate a diode having multiple junctions in accordance with one embodiment.

FIG. 5 shows an exemplary fabrication method 500 for fabricating a diode having a composite anode region and a composite cathode region with one or more buried cathode regions as described above. The diode is fabricated with a semiconductor substrate, the regions or layers of which may have the conductivity types of the examples described above, or be alternatively configured with the opposite conductivity types. The method includes a sequence of acts or steps, only the salient of which are depicted for convenience in illustration.

The method may begin with, or include, a step 501 in which an n-type implantation procedure is performed to form the buried layer 30. In an alternative embodiment, step 501 may be omitted. The implantation procedure may be performed on an SOI substrate. The substrate may include an original p-type semiconductor substrate 26 on which the insulator layer 28, epitaxial, and/or other layers are disposed. In a step 502, the p-type epitaxial layer 24 is grown. The epitaxial layer 24 defines the surface 40 of the semiconductor substrate. The semiconductor substrate may be an SOI substrate. Any number of epitaxial layers may be grown. One or more procedures may be implemented to define the lateral periphery. Such procedures may include forming one or more deep trench isolation (DTI) regions as described above. The DTI regions may be formed via, for example, an implantation procedure that damages or otherwise changes the structure of the epitaxial layer(s).

The outer well region 60 of the composite cathode region may be formed in a step 504. An n-type high voltage or power FET well implantation procedure may be performed to form the well region 60. The implantation procedure may be configured to form a body of a p-type high voltage FET device. The mask used for the implantation procedure may define a hole in the well region 60 as shown and described in connection with FIG. 1. Alternatively, the mask may allow the well region 60 to extend across the device area without a hole. The doping provided by the implantation procedure may thus contribute to establishing the breakdown voltage of the junctions of the diode.

In a step 506, the STI regions 38, 46 or other isolation trenches may be formed at the surface 40 of the semiconductor substrate. The STI regions 38, 46 may be formed via any now known or hereafter developed procedure. For example, step 506 may include the formation of a trench and the deposition (e.g., chemical vapor deposition, or CVD) of one or more materials in the trench. In some embodiments, the trench is filled with silicon oxide. Additional or alternative materials may be deposited.

The cathode contact region 44 may be formed in a step 508. An n-type source/drain implantation procedure may be performed to form the cathode contact region 44. The cathode contact region 44 may be disposed laterally outward of the STI region 46 as described above. The cathode contact region 44 may be formed in or on the outer well region 60.

In a step 510, one or more implantation procedures may be performed to form the buried well region 50 of the composite cathode region. The implantation procedure(s) may be configured as n-type FET device well implantation procedures. In one example, the implantation procedures may include a procedure configured to form a body region of a p-type logic or other low voltage FET device. Alternatively or additionally, the implantation procedures may include a procedure configured to form a drift or other well region of an n-type power FET device, such as an LDMOS transistor device. Alternatively or additionally, the implantation procedures may include a procedure configured to form an accumulation or other well region of an n-type power FET device, as described above. The same or different dopant ions may be used in the procedures. The implementation procedure(s) may be configured to achieve different dopant profiles as described above. A mask for the implantation procedure(s) may be configured to allow the dopant to be implanted across the entire lateral extent of the device area. The buried region may thus extend laterally across the constituent regions of the composite anode region to establish multiple junctions, as described above. In the example described in connection with FIG. 4, three implantation procedures are used. The implementation procedures may overlap to achieve a dopant concentration level to establish a target breakdown voltage for the diode.

A p-type dopant implantation procedure is performed in a step 512 to form one of the constituent regions of the composite anode region. In this embodiment, the intermediate anode region 48 is formed in step 512. The p-type dopant implantation procedure may be configured to form a power FET terminal extension region, such as an LDD region, as described above. For example, the intermediate anode region 48 may be formed by performing a PLDD implantation procedure. The dopant implantation procedure may be configured to establish the junction with the intermediate anode region 48 at a shallower depth than a depth of anode contact region 42 (which is subsequently formed in step 518), as described above.

In a step 514, an implantation procedure is performed to form the buried region 52 of the composite cathode region. The implantation procedure may be configured to form a power FET terminal extension region. The buried region 52 may be formed by performing an NLDD implantation procedure.

The silicide block 62 is deposited in a step 516 on the surface of the substrate. The silicide block 62 is deposited over an interface between the isolation region and the intermediate anode region, as described above. One or more materials may be deposited. For example, silicon dioxide and silicon nitride may be used.

An implantation procedure is performed in a step 518 to form the contact region 42 of the composite anode region. The implantation procedure may be configured to form p-type source/drain regions of FET devices. In this embodiment, the silicide block 62 is used as a hard mask for the implantation procedure.

The above-described dopant implantation procedures are configured such that the buried region 50 extends laterally across the anode contact region 42 and the intermediate anode region 48 to establish middle and outer junctions of the diode, respectively, as described above.

The above-described p-type dopant implantation procedures are configured such that the intermediate anode region 48 is disposed between the isolation region 46 and the anode contact region 42 and is electrically connected with the anode contact region 42.

The dopant implantation procedures in steps 512 and 518 are configured such that the buried region 52 is disposed adjacent the anode contact region 42 to establish the innermost junction. As described above, the innermost junction has a lower breakdown voltage than the middle and outer junctions. The procedures may also be configured such that the middle junction has a lower breakdown voltage than the outer junction.

In some embodiments, the implant procedures implemented in steps 506 and 508 correspond with implants performed and configured to fabricate regions of FET devices. For example, the p-type implant may be a logic FET implant procedure. The n-type implant may be a power FET well implant procedure.

The ordering of the steps or acts may vary in other embodiments. For example, formation of the isolation regions, e.g., the STI regions, may be performed before step 504 or other cathode region formation. The n-type well implants in steps 504 and 510 may be performed before the other implants. Alternatively or additionally, the drain/source implants performed in steps 508 and 518 may be the last implants implemented, e.g., after the silicide block deposition of step 516.

Additional acts may be implemented at various points during the fabrication procedure. For example, one or more acts may be directed to defining an active area of the device. In some cases, such acts may include the formation of one or more device isolating wells, layers, or other regions. One or more metal layers may be deposited. Any number of additional STI regions may be formed. The procedures may be implemented in various orders. Additional or alternative procedures may be implemented.

The disclosed diodes may be fabricated cost effectively during a process flow configured for one or more FET device designs. The disclosed diodes may be fabricated without additional masks or procedures.

In a first aspect, a diode includes a semiconductor substrate having a surface, a first contact region disposed at the surface of the semiconductor substrate and having a first conductivity type, a second contact region disposed at the surface of the semiconductor substrate, laterally spaced from the first contact region, and having a second conductivity type, an intermediate region disposed in the semiconductor substrate between the first and second contact regions, electrically connected with the first contact region, and having the first conductivity type, and a buried region disposed in the semiconductor substrate, having the second conductivity type, and electrically connected with the second contact region. The buried region extends laterally across the first contact region and the intermediate region to establish first and second junctions, respectively. The first junction has a lower breakdown voltage than the second junction.

In a second aspect, a diode includes a semiconductor substrate having a surface, a first contact region disposed at the surface of the semiconductor substrate and having a first conductivity type, a second contact region disposed at the surface of the semiconductor substrate, laterally spaced from the first contact region, and having a second conductivity type, an intermediate region disposed in the semiconductor substrate between the first and second contact regions, electrically connected with the first contact region, and having the first conductivity type, and a buried region disposed in the semiconductor substrate, having the second conductivity type, and electrically connected with the second contact region. The buried region extends laterally from the second contact region to the first contact region and across the intermediate region to establish first and second junctions with the first contact region and the intermediate region, respectively. The first junction has a lower breakdown voltage than the second junction.

In a third aspect, a method of fabricating a diode including a plurality of regions of a first conductivity type in a semiconductor substrate and a buried region of a second conductivity type in the semiconductor substrate, includes performing a first dopant implantation procedure to form the buried region, performing a second dopant implantation procedure to form an intermediate region of the plurality of regions, and performing a third dopant implantation procedure to form a contact region of the plurality of regions. The second and third dopant implantation procedures are configured such that the intermediate region is electrically connected with the contact region. The first, second, and third dopant implantation procedures are configured such that the buried region extends laterally across the contact region and the intermediate region to establish first and second junctions of the diode, respectively, and such that the first junction has a lower breakdown voltage than the second junction.

Semiconductor devices with a conductive gate electrode positioned over a dielectric or other insulator may be considered MOS devices, despite the lack of a metal gate electrode and an oxide gate insulator. Accordingly, the terms metal-oxide-semiconductor and the abbreviation "MOS" may be used even though such devices may not employ metals or oxides but various combinations of conductive materials, e.g., metals, alloys, silicides, doped semiconductors, etc., instead of simple metals, and insulating materials other than oxides (e.g., nitrides, oxy-nitride mixtures, etc.). Thus, as used herein, the terms MOS and LDMOS are intended to include such variations.

The present invention is defined by the following claims and their equivalents, and nothing in this section should be taken as a limitation on those claims. Further aspects and advantages of the invention are discussed above in conjunction with the preferred embodiments and may be later claimed independently or in combination.

While the invention has been described above by reference to various embodiments, it should be understood that many changes and modifications may be made without departing from the scope of the invention. It is therefore intended that the foregoing detailed description be regarded as illustrative rather than limiting, and that it be understood that it is the following claims, including all equivalents, that are intended to define the spirit and scope of this invention.

The invention claimed is:

1. A method of fabricating a diode comprising a plurality of regions of a first conductivity type in a semiconductor substrate, the method comprising:
    forming a buried region of a second conductivity type in the semiconductor substrate;
    performing a first dopant implantation procedure to form an intermediate region of the plurality of regions; and
    performing a second dopant implantation procedure in addition to the first dopant implantation procedure to form a contact region of the plurality of regions;
    wherein the first and second dopant implantation procedures are configured such that the intermediate region is electrically connected with the contact region;
    wherein the first and second dopant implantation procedures are configured such that the buried region extends laterally across the contact region and the intermediate region to establish first and second junctions of the diode, respectively, and such that the first junction has a lower breakdown voltage than the second junction.

2. The method of claim 1, wherein forming the buried region comprises implementing a power field-effect transistor (FET) well implantation procedure.

3. The method of claim 2, wherein forming the buried region further comprises implementing a logic field-effect transistor (FET) well implantation procedure.

4. The method of claim 1, further comprising depositing a silicide block on the surface of the substrate over the intermediate region.

5. The method of claim 1, wherein the first implantation procedure comprises a power field-effect transistor (FET) terminal extension implantation procedure.

6. The method of claim 1, further comprising performing a third dopant implantation procedure to form a further buried region in the semiconductor substrate of the second conductivity type, wherein the second and third dopant implantation procedures are configured such that:
    the further buried region is disposed adjacent the contact region to establish a third junction; and
    the third junction has a lower breakdown voltage than the first and second junctions.

7. The method of claim 6, wherein the first and third dopant implantation procedures are configured such that the further buried region is laterally spaced from the intermediate region such that the first and second junctions are disposed between the third junction and the second contact region.

8. The method of claim 6, wherein the third dopant implantation procedure is configured such that the buried region and the further buried region have dopant concentration levels on a same order of magnitude.

9. The method of claim 6, wherein the second and third dopant implantation procedures are configured such that the further buried region is disposed on the buried region between the contact region and the buried region.

10. The method of claim 1, further comprising forming an isolation region at a surface of the substrate such that the intermediate region is disposed between the isolation region and the contact region.

11. A method of fabricating a diode comprising a plurality of regions of a first conductivity type in a semiconductor substrate, the method comprising:
    forming an isolation region at a surface of the semiconductor substrate;
    forming a buried region of a second conductivity type in the semiconductor substrate;
    performing a first dopant implantation procedure to form an intermediate region of the plurality of regions, the intermediate region being adjacent to the isolation region; and
    performing a second dopant implantation procedure in addition to the first dopant implantation procedure to form a contact region of the plurality of regions, the intermediate region being disposed between the isolation region and the contact region;
    wherein the first and second dopant implantation procedures are configured such that the intermediate region is electrically connected with the contact region;
    wherein the first and second dopant implantation procedures are configured such that the buried region extends laterally across the contact region and the intermediate region to establish first and second junctions of the diode, respectively, and such that the first junction has a lower breakdown voltage than the second junction.

12. The method of claim 11, wherein forming the buried region comprises implementing a power field-effect transistor (FET) well implantation procedure.

13. The method of claim 11, wherein the first implantation procedure comprises a power field-effect transistor (FET) terminal extension implantation procedure.

14. The method of claim 11, further comprising performing a third dopant implantation procedure to form a further buried region in the semiconductor substrate of the second conductivity type, wherein the second and third dopant implantation procedures are configured such that:
    the further buried region is disposed adjacent the contact region to establish a third junction; and
    the third junction has a lower breakdown voltage than the first and second junctions, and
    wherein the third dopant implantation comprises a further power FET terminal extension implantation procedure.

15. A method of fabricating a diode comprising a plurality of regions of a first conductivity type in a semiconductor substrate and a buried region of a second conductivity type in the semiconductor substrate, the method comprising:

performing a first dopant implantation procedure to form the buried region;

performing a second dopant implantation procedure to form an intermediate region of the plurality of regions;

performing a third dopant implantation procedure to form a contact region of the plurality of regions;

wherein the second and third dopant implantation procedures are configured such that the intermediate region is electrically connected with the contact region;

wherein the first, second, and third dopant implantation procedures are configured such that the buried region extends laterally across the contact region and the intermediate region to establish first and second junctions of the diode, respectively, and such that the first junction has a lower breakdown voltage than the second junction.

16. The method of claim 15, further comprising performing a fourth dopant implantation procedure to form a further buried region in the semiconductor substrate of the second conductivity type, wherein the third and fourth dopant implantation procedures are configured such that:

the further buried region is disposed adjacent the contact region to establish a third junction; and the third junction has a lower breakdown voltage than the first and second junctions.

17. The method of claim 15, wherein performing the first implantation procedure comprises implementing a first power field-effect transistor (FET) well implantation procedure, the method further comprising implementing a second power FET well implantation procedure to implant further dopant of the second conductivity type to form the buried region.

18. The method of claim 15, further comprising depositing a silicide block on the surface of the substrate over the intermediate region.

19. The method of claim 15, wherein the first implantation procedure comprises a logic field-effect transistor (FET) well implantation procedure.

20. The method of claim 15, wherein the second implantation procedure comprises a power field-effect transistor (FET) terminal extension implantation procedure.

* * * * *